(12) United States Patent
Nam et al.

(10) Patent No.: US 11,031,476 B2
(45) Date of Patent: Jun. 8, 2021

(54) SEMICONDUCTOR DEVICE AND METHOD FOR FABRICATING THE SAME

(71) Applicant: XIA TAI XIN SEMICONDUCTOR (QING DAO) LTD., Qingdao (CN)

(72) Inventors: Chang-Hyeon Nam, Singapore (SG); Injoon Yeo, Singapore (SG)

(73) Assignee: XIA TAI XIN SEMICONDUCTOR (QING DAO) LTD., Qingdao (CN)

(*) Notice: Subject to any disclaimer, the term of this patent is extended or adjusted under 35 U.S.C. 154(b) by 0 days.

(21) Appl. No.: 16/710,075

(22) Filed: Dec. 11, 2019

(65) Prior Publication Data

US 2020/0219984 A1 Jul. 9, 2020

Related U.S. Application Data

(60) Provisional application No. 62/778,988, filed on Dec. 13, 2018.

(51) Int. Cl.
*H01L 29/40* (2006.01)
*H01L 29/423* (2006.01)
*H01L 21/762* (2006.01)
*H01L 27/108* (2006.01)

(52) U.S. Cl.
CPC ...... *H01L 29/401* (2013.01); *H01L 21/76229* (2013.01); *H01L 27/10823* (2013.01); *H01L 27/10891* (2013.01); *H01L 29/4236* (2013.01)

(58) Field of Classification Search
CPC ........... H01L 29/4236; H01L 27/10891; H01L 27/10823; H01L 21/76802; H01L 21/76831
See application file for complete search history.

(56) References Cited

U.S. PATENT DOCUMENTS

2018/0145080 A1* 5/2018 Kim .................. H01L 27/10814

* cited by examiner

*Primary Examiner* — Julia Slutsker
(74) *Attorney, Agent, or Firm* — ScienBiziP, P.C.

(57) ABSTRACT

A semiconductor device includes a semiconductor substrate, a silicon oxide layer, a titanium nitride layer, a metal layer, and a first silicon nitride layer. At least one trench is recessed inward from a surface of the semiconductor substrate. The silicon oxide layer is formed on an inner wall of the at least one trench. The titanium nitride layer is formed on a portion of the silicon oxide layer away from the surface of the semiconductor substrate. The metal layer is filled in a portion of each of the at least one trench. The metal layer is selectively deposited on the titanium nitride layer and comprises a material selected from ruthenium and cobalt. The first silicon nitride layer is filled in a remaining portion of each of the at least one trench to contact the metal layer, and is surrounded by the silicon oxide layer.

10 Claims, 14 Drawing Sheets

SEMICONDUCTOR DEVICE AND METHOD FOR FABRICATING THE SAME

FIELD

The subject matter herein generally relates to a semiconductor, and more particularly to a semiconductor device and a method for fabricating the semiconductor device.

BACKGROUND

Semiconductor memory device is configured to store data or program commands. Common memory devices include dynamic random access memory (DRAM), which is widely used in digital electronics. As the dimensions of semiconductor devices are being reduced (e.g., to 20 nm scale) in response to an increased demand for highly integrated semiconductor memory devices, advanced semiconductor structures and semiconductor manufacturing processes are proposed. For example, buried word line structure for DRAM is designed to reduce memory cell area by burying word lines in trenches formed in a semiconductor substrate. However, in the conventional manufacturing process, when tungsten is deposited in the trench, gaps are easily generated, resulting in poor product or shortened service life.

BRIEF DESCRIPTION OF THE DRAWINGS

Implementations of the present disclosure will now be described, by way of embodiments, with reference to the attached figures.

DETAILED DESCRIPTION

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale, and the proportions of certain parts may be exaggerated to better illustrate details and features of the present disclosure.

The term "comprising," when utilized, means "including, but not necessarily limited to"; it specifically indicates open-ended inclusion or membership in the so-described combination, group, series, and the like.

Figure 1:
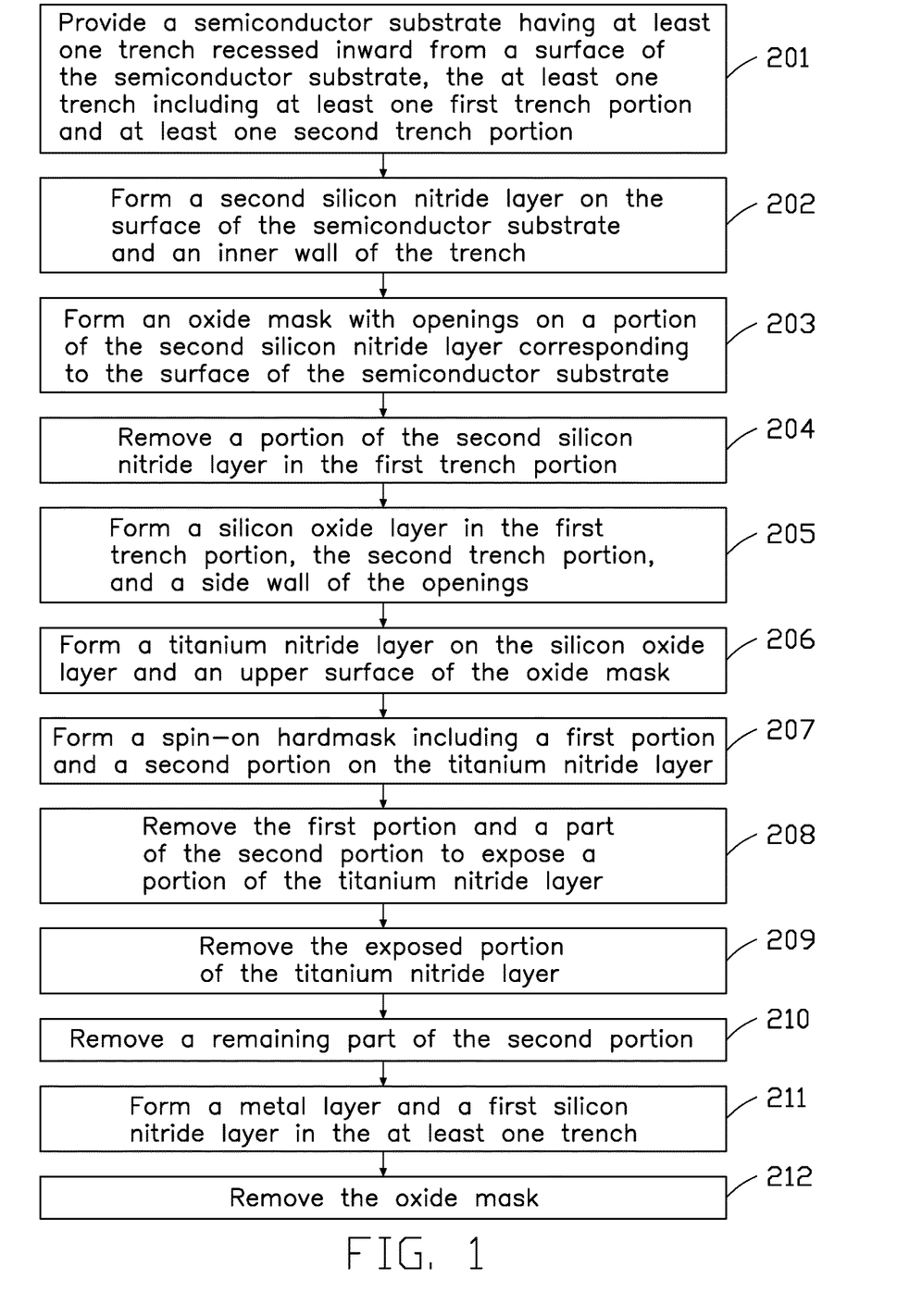
FIG. 1 is a flowchart of an embodiment of a method for fabricating a semiconductor device.

FIG. 1 illustrates a flowchart of a method in accordance with an embodiment. The method for fabricating the semiconductor device 100 (shown in FIG. 12) is provided by way of embodiments, as there are a variety of ways to carry out the method. Each block shown in FIG. 1 represents one or more processes, methods, or subroutines carried out in the method. Furthermore, the illustrated order of blocks can be changed. Additional blocks may be added or fewer blocks may be utilized, without departing from this disclosure. The method can begin at block 201.

Figure 2:
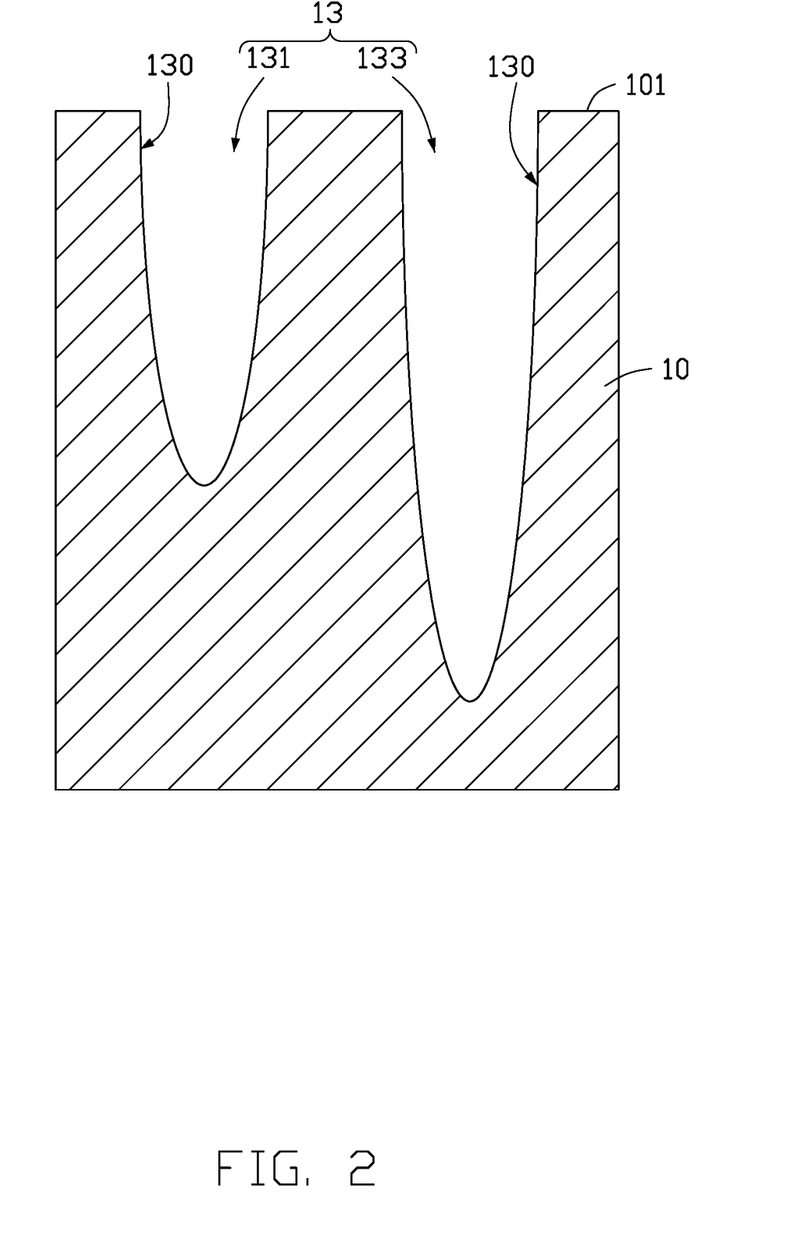
FIG. 2 is a cross-sectional view of an embodiment of a semiconductor substrate.

At block 201, referring to FIG. 2, a semiconductor substrate 10 is provided, and at least one trench 13 is recessed inward from a surface 101 of the semiconductor substrate 10.

In at least one embodiment, the at least one trench 13 includes at least one first trench portion 131 and at least one second trench portion 133. The at least one first trench portion 131 and the at least one second trench portion 133 are spaced. The first trench portion 131 may be used as a buried word line trench. The second trench portion 133 may be used as a STI trench (STI=Shallow Trench Isolation).

In at least one embodiment, a depth of the first trench portion 131 may be 1500 Å. A depth of the second trench portion 133 may be 2800 Å. In another embodiment, the depth of the first trench portion 131 and the depth of the second trench portion 133 may be varied as needed, respectively.

Figure 3:
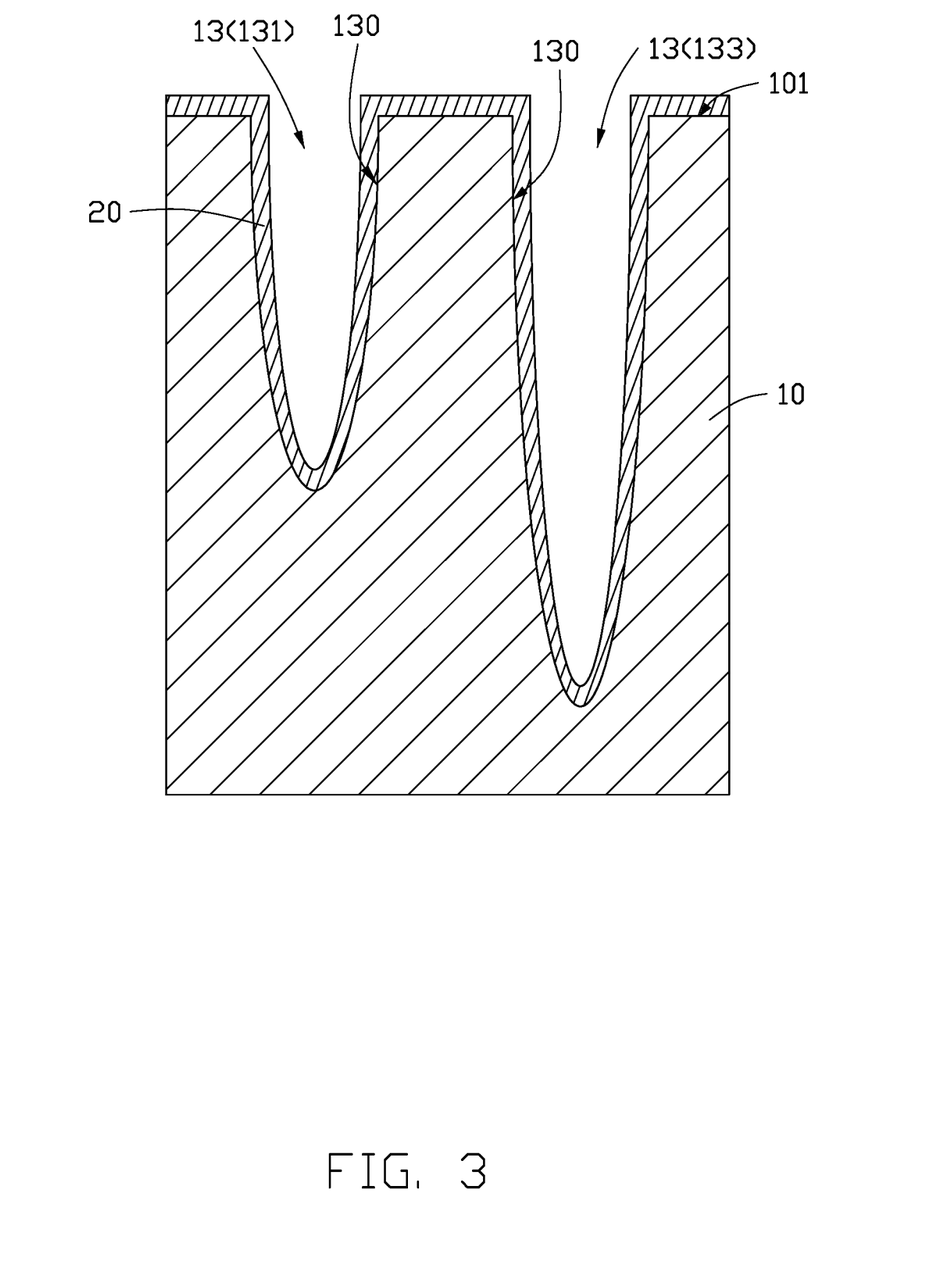
FIG. 3 is a cross-sectional view showing a second silicon nitride layer on the semiconductor substrate of FIG. 2.

At block 202, referring to FIG. 3, a second silicon nitride layer 20 is formed on the surface 101 of the semiconductor substrate 10 and an inner wall 130 of the at least one trench 13.

In at least one embodiment, the second silicon nitride layer 20 has a thickness of 250 Å. In another embodiment, the thickness of the second silicon nitride layer 20 may be varied as needed.

Figure 4:
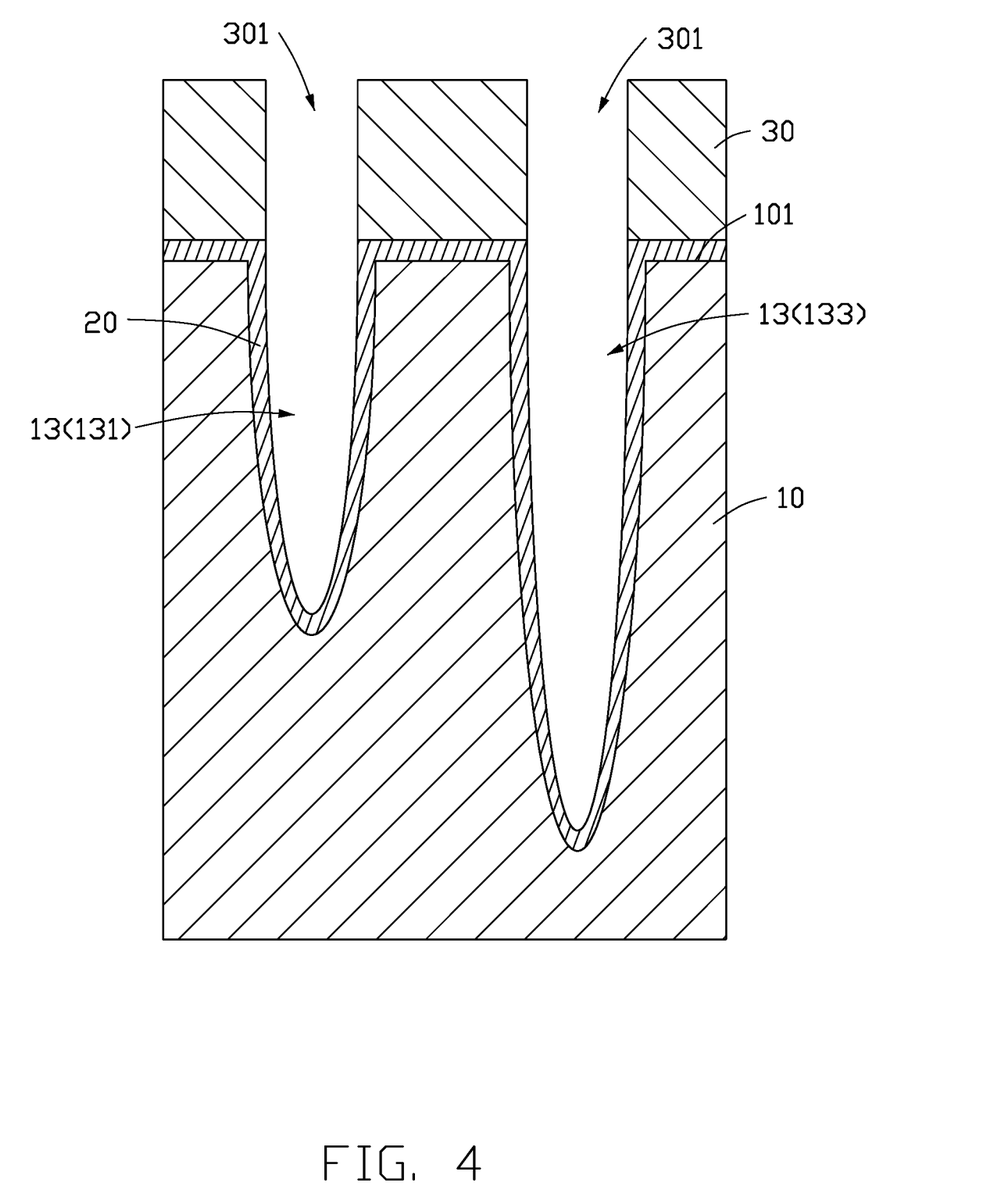
FIG. 4 is a cross-sectional view showing an oxide mask on the semiconductor substrate of FIG. 3.

At block 203, referring to FIG. 4, an oxide mask 30 is formed on a portion of the second silicon nitride layer 20 corresponding to the surface 101 of the semiconductor substrate 10. The oxide mask 30 includes an opening 301 corresponding to each trench 13.

In at least one embodiment, the oxide mask 30 may have a thickness of 200 Å. In another embodiment, the thickness of the oxide mask 30 may be varied as needed.

Figure 5:
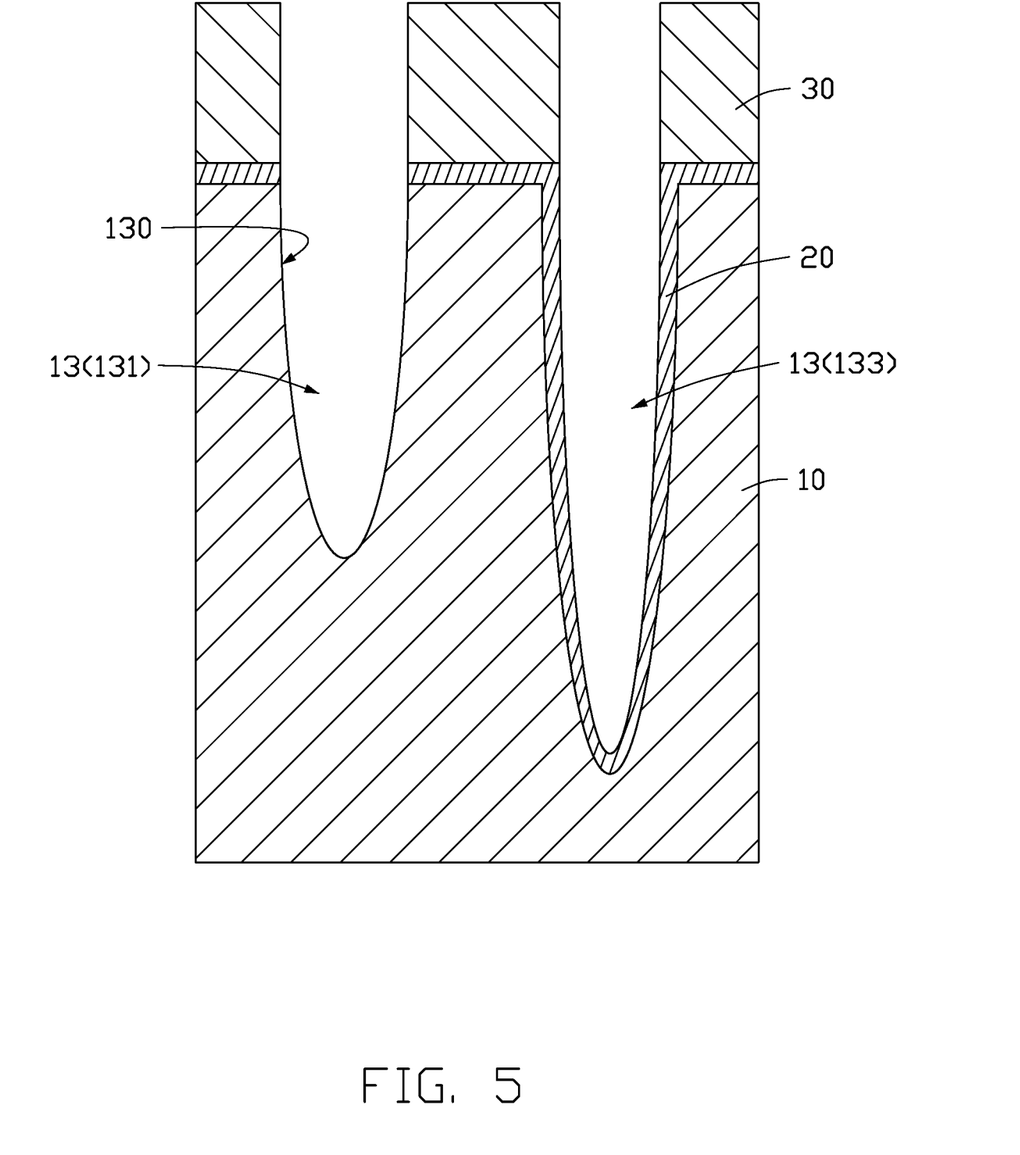
FIG. 5 is a cross-sectional view showing a portion of the second silicon nitride layer removed from the semiconductor substrate of FIG. 4.

At block 204, referring to FIG. 5, a portion of the second silicon nitride layer 20 on the inner wall 130 of the at least one first trench portion 131 is removed.

In at least one embodiment, the portion of the second silicon nitride layer 20 on the inner wall 130 of the at least one first trench portion 131 is removed by etching.

Figure 6:
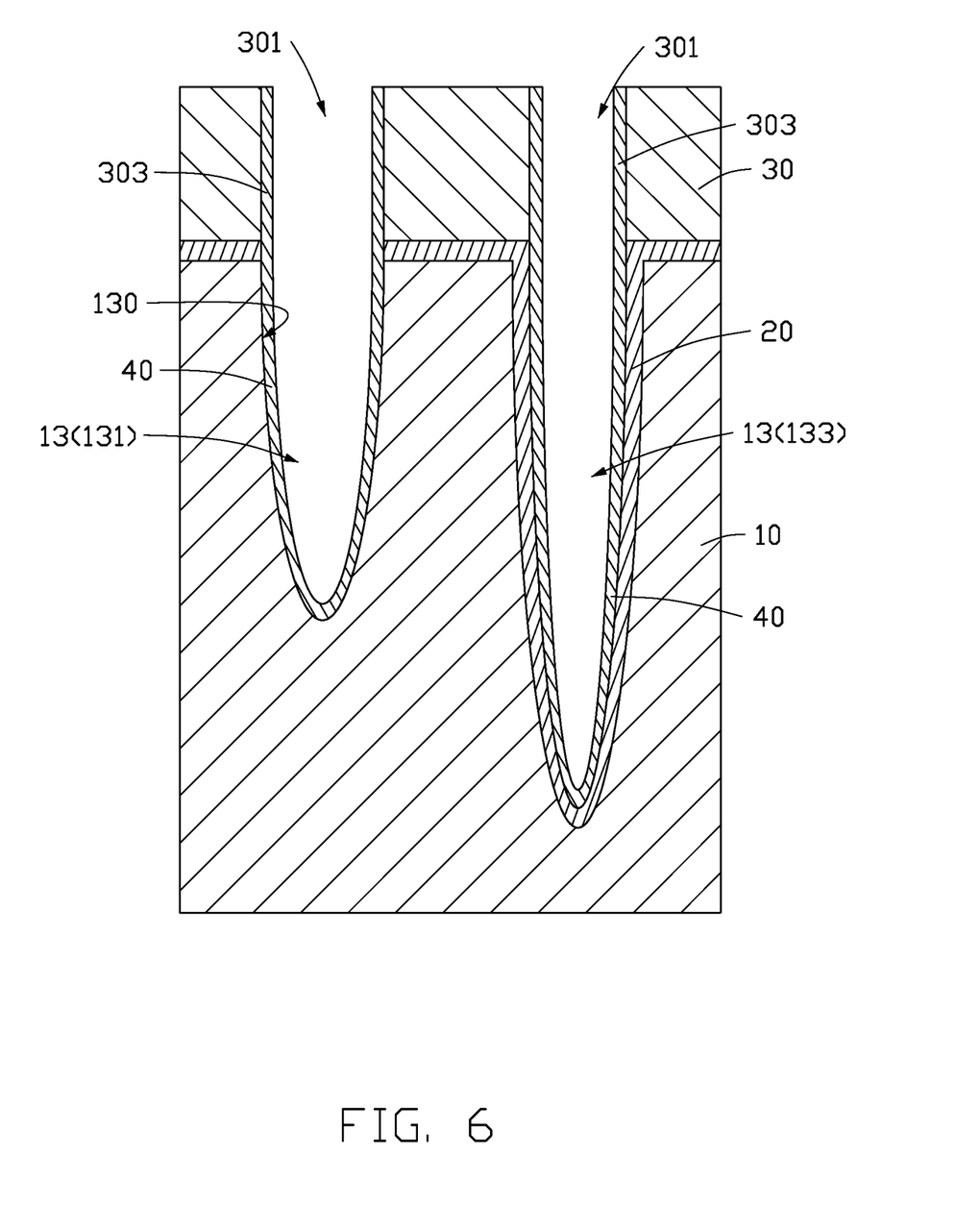
FIG. 6 is a cross-sectional view showing a silicon oxide layer on the semiconductor substrate of FIG. 5.

At block 205, referring to FIG. 6, a silicon oxide layer 40 is formed on the inner wall 130 of the at least one first trench portion 131, a portion of the second silicon nitride layer 20 in the at least one second trench portion 133, and a side wall 303 of the opening 30.

In at least one embodiment, a thickness of the silicon oxide layer 40 is in a range of 60 Å to 70 Å.

Figure 7:
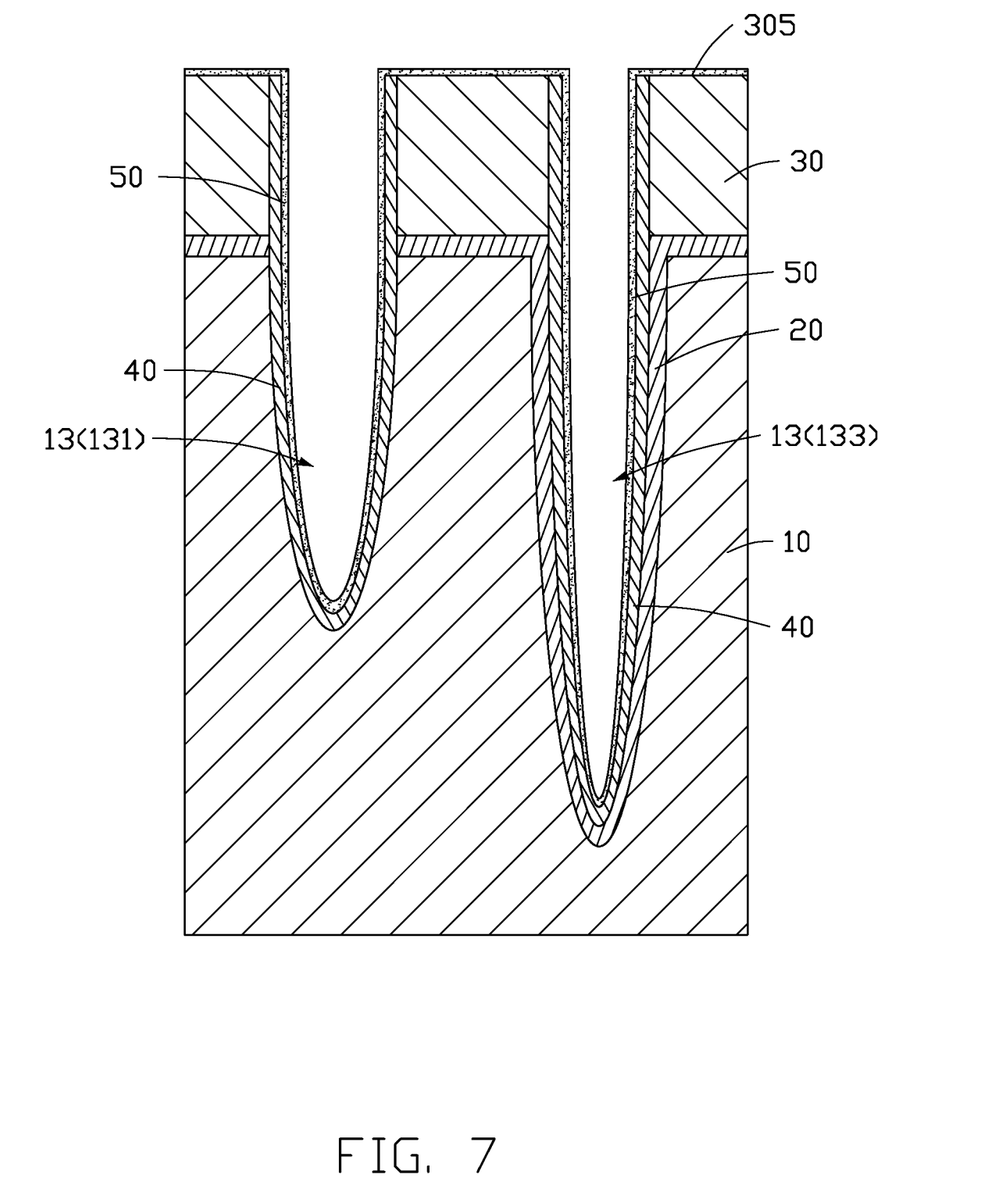
FIG. 7 is a cross-sectional view showing a titanium nitride layer on the silicon oxide layer and the oxide mask of FIG. 6.

At block 206, referring to FIG. 7, a titanium nitride layer 50 is formed on the silicon oxide layer 40 and an upper surface 305 of the oxide mask 30 facing away from the semiconductor substrate 10.

In at least one embodiment, a thickness of the titanium nitride layer 50 is in a range of 10 Å to 20 Å.

Figure 8:
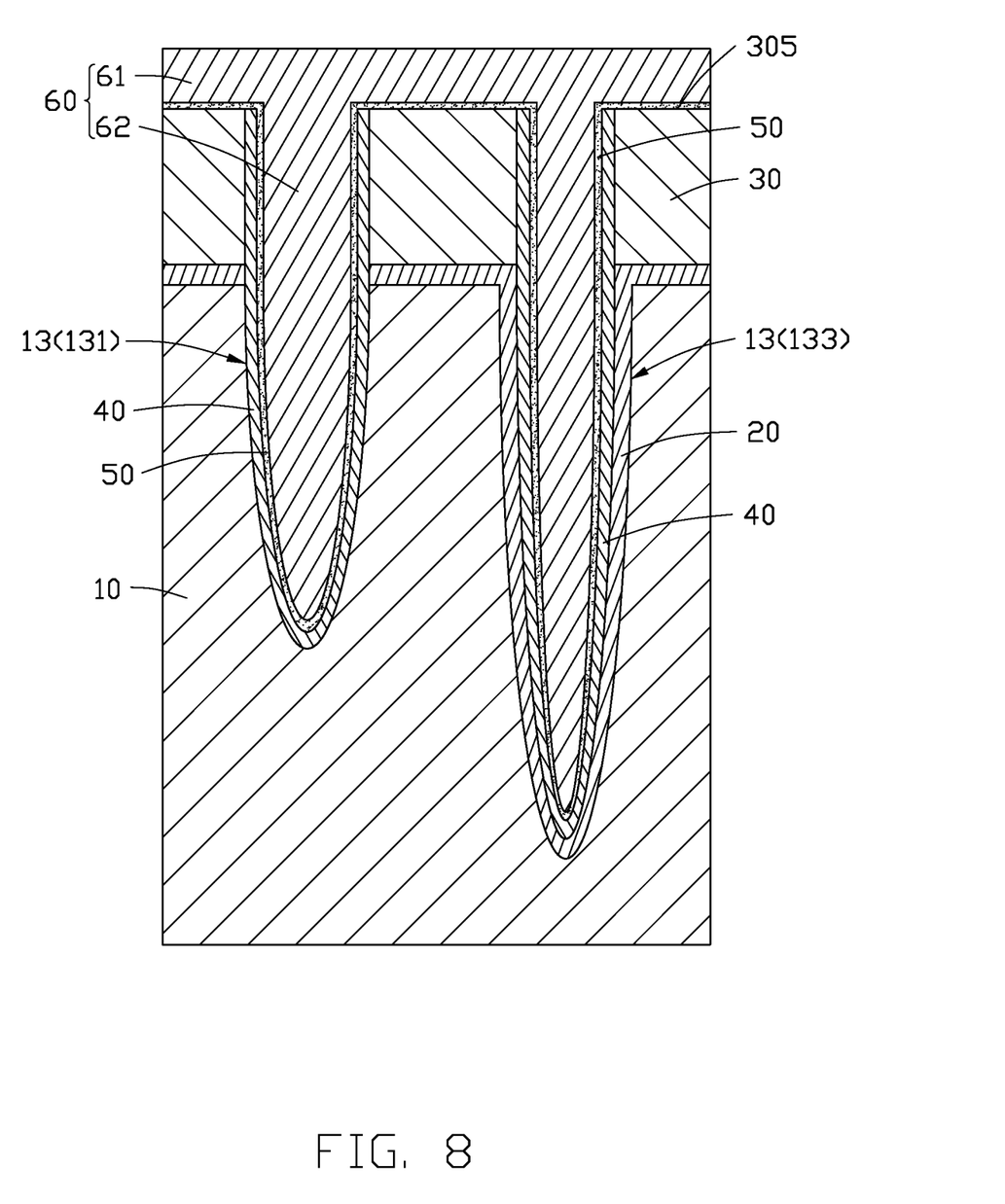
FIG. 8 is a cross-sectional view showing a spin-on hard mask including a first portion and a second portion on the titanium nitride layer of FIG. 7.

At block 207, referring to FIG, 8, a spin-on hard mask 60 is formed on the titanium nitride layer 50. The spin-on hard mask 60 includes a first portion 61 above the upper surface 305 of the oxide mask 30 and a second portion 63 filled in the at least one trench 13.

Figure 9:
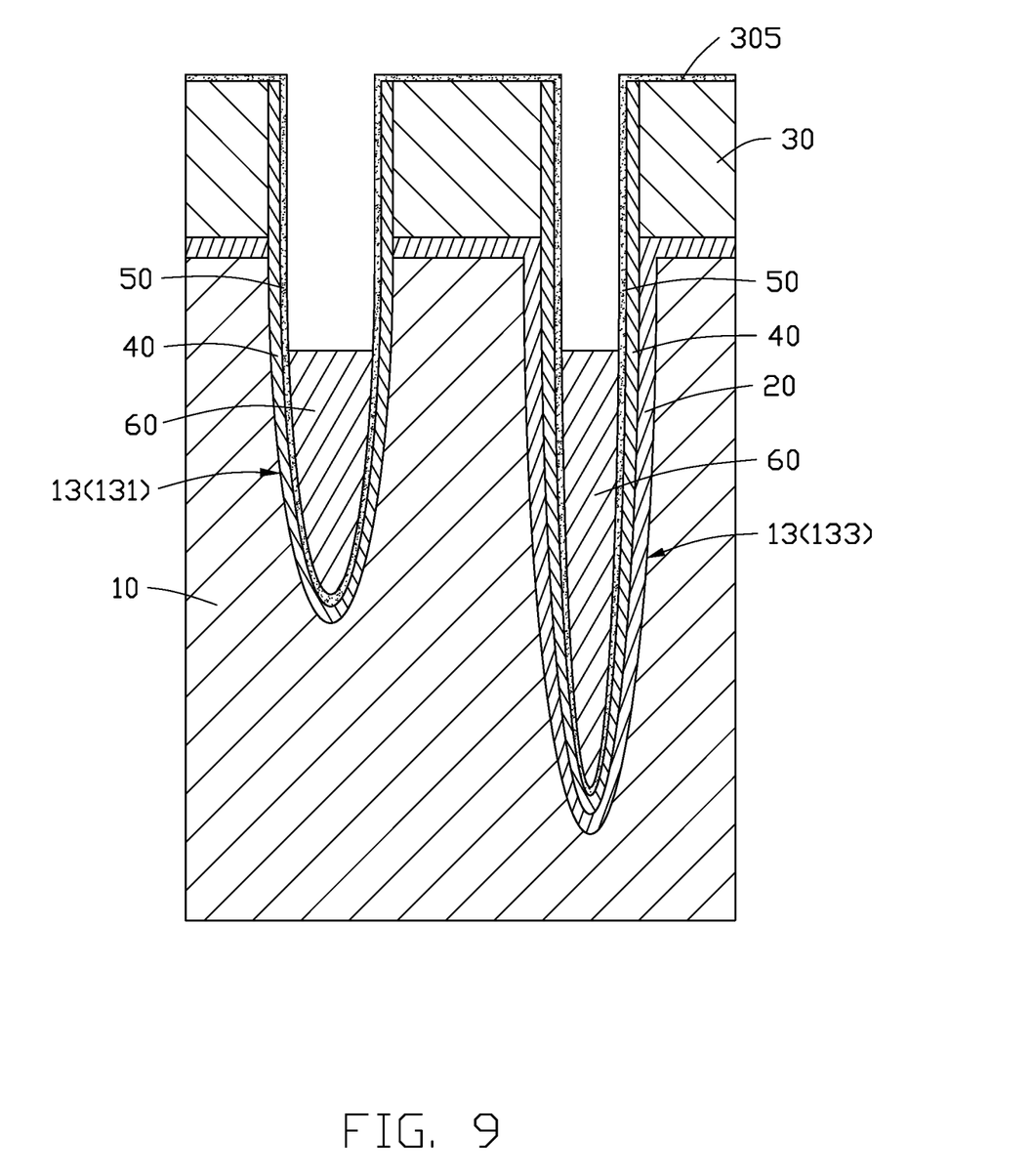
FIG. 9 is a cross-sectional view showing the first portion and a part of the second portion removed from the titanium nitride layer of FIG. 8.

At block 208, referring to FIG. 9, the first portion 61 and a part of the second portion 63 are removed by an etch back process to expose a portion of the titanium nitride layer 50.

In at least one embodiment, a distance from a side of a remaining part of the second portion 63 corresponding to one of the at least one first trench portion 131 facing away from a bottom of the corresponding first trench portion 131 to the bottom of the corresponding first trench portion 131 is in range of 700 Å to 1000 Å. A distance from a side of a remaining part of the second portion 63 corresponding to one of the at least one second trench portion 133 facing away from a bottom of the corresponding second trench portion 133 to the bottom of the corresponding second trench portion 133 is in range of 2000 Å to 2300 Å. In another embodiment, the distance from a side of the remaining part of the second portion 63 corresponding to one of the at least one trench 13 facing away from the bottom of the corresponding trench 13 to the bottom of the corresponding trench 13 may be varied as needed.

Figure 10:
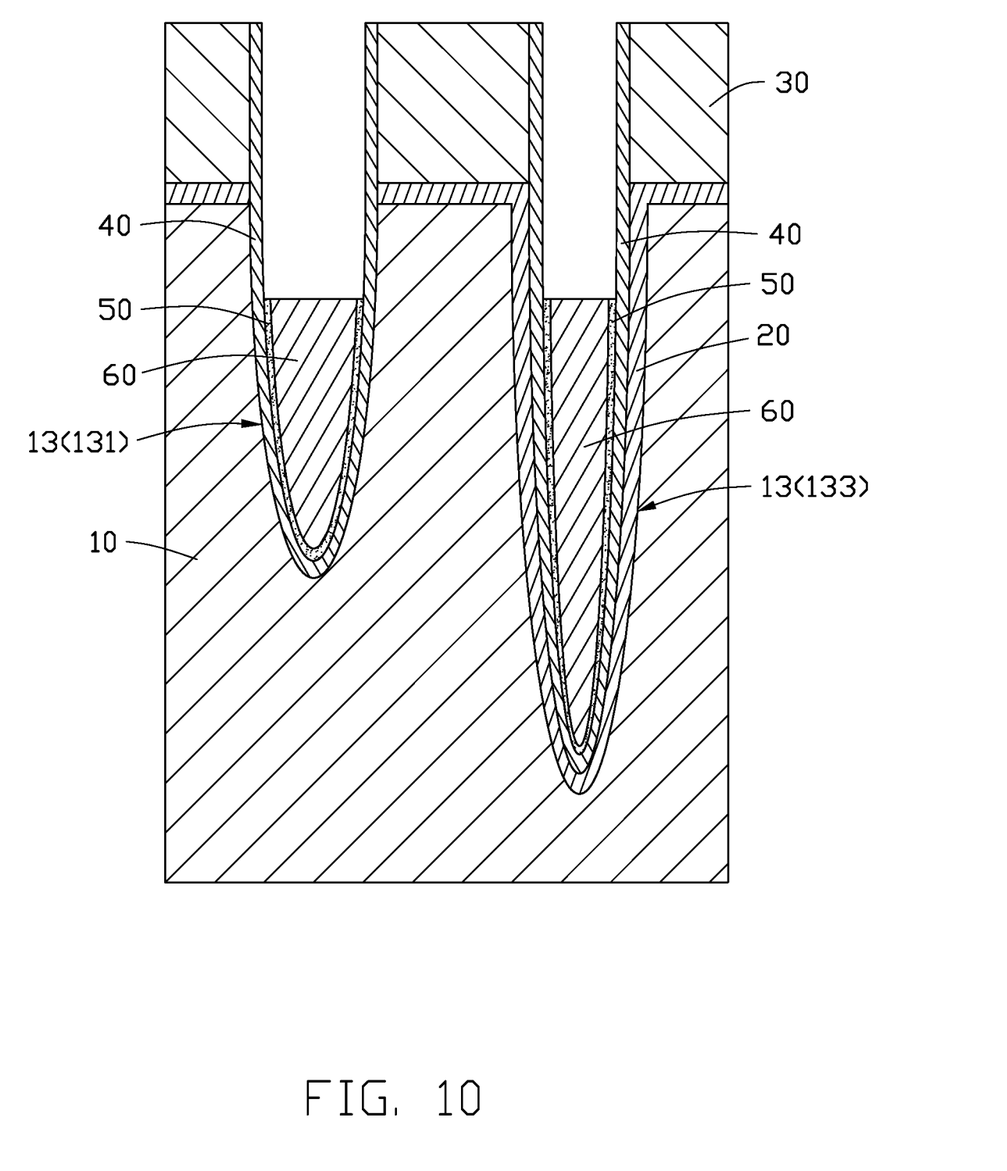
FIG. 10 is a cross-sectional view showing a portion of the titanium nitride layer removed from the semiconductor substrate of FIG. 9.

At block 209, referring to FIG. 10, the exposed titanium nitride layer 50 is removed by a wet type etching. A remaining portion of the titanium nitride layer 50 is encircled by the remaining part of the second portion 63 and the silicon oxide layer 40. In at least one embodiment, the remaining portion of the titanium nitride layer 50 is flush with the remaining part of the second portion 63.

In at least one embodiment, the exposed titanium nitride layer 50 is removed by hydrogen peroxide.

Figure 11:
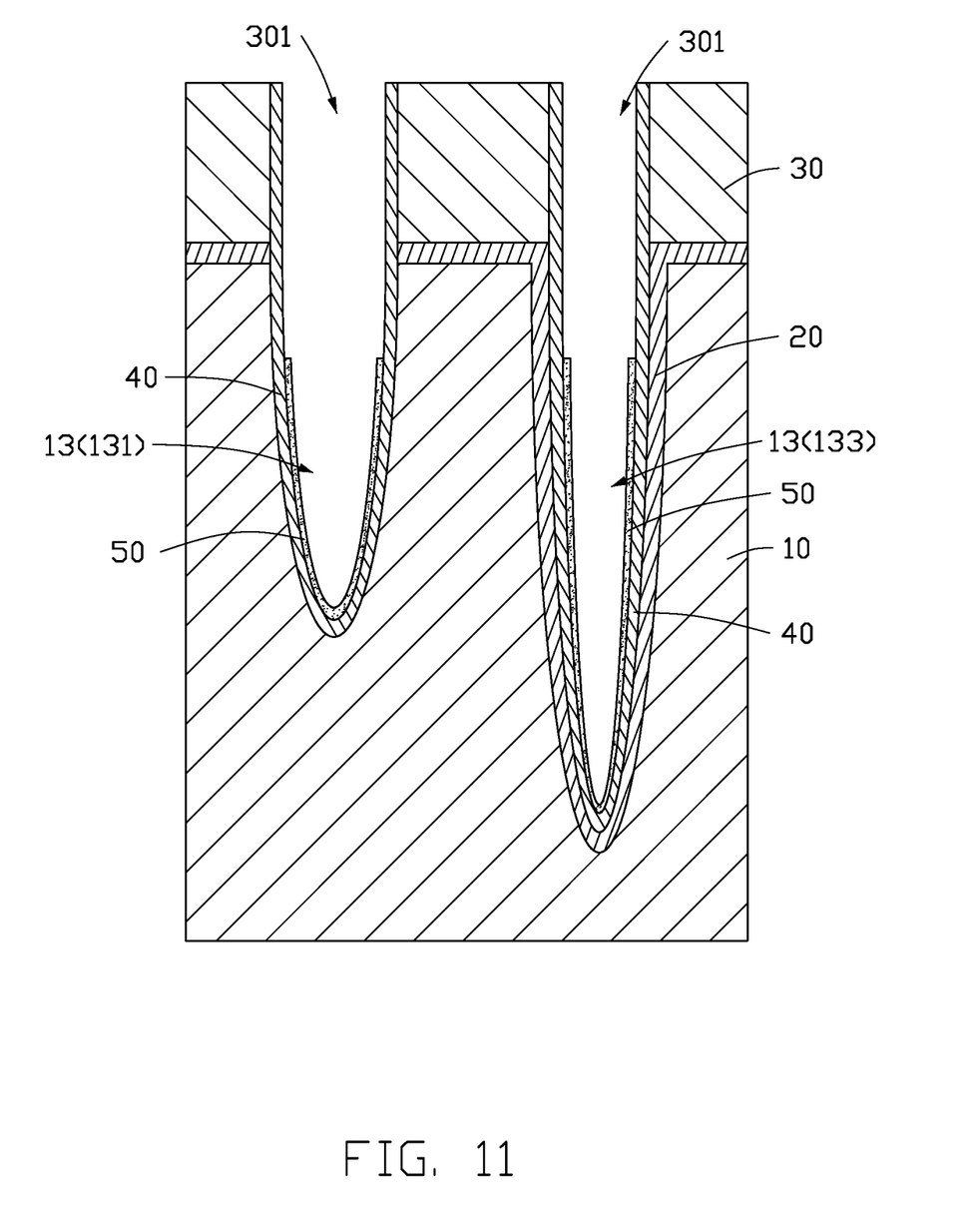
FIG. 11 is a cross-sectional view showing a remaining part of the second portion removed from the semiconductor substrate of FIG. 10.

At block 210, referring to FIG. 11, the remaining part of the second portion 63 is removed by an ashing process to expose the remaining portion of the titanium nitride layer 50.

Figure 12:
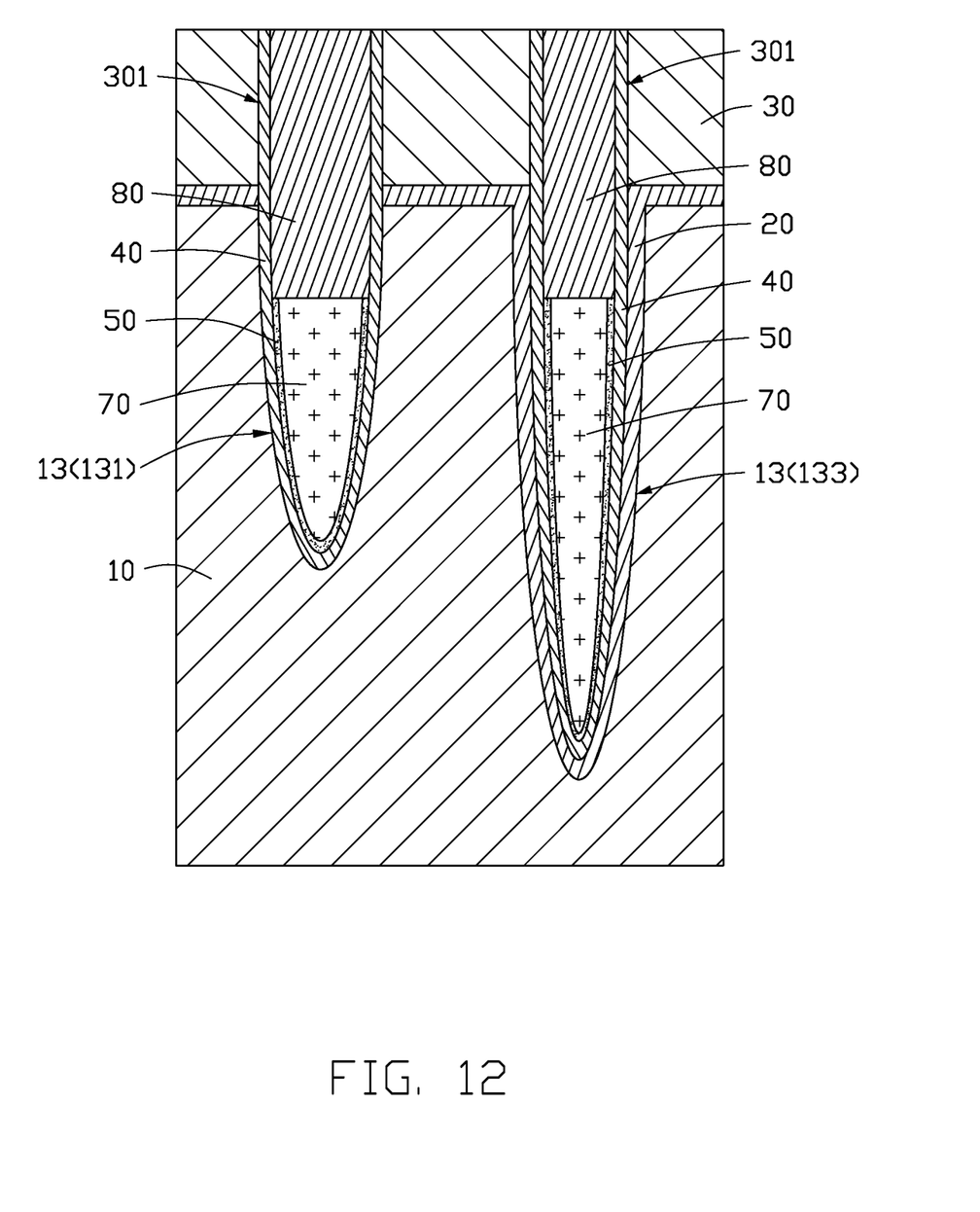
FIG. 12 is a cross-sectional view showing a metal layer and a first silicon nitride layer on the semiconductor substrate of FIG. 11.

At block 211, referring to FIG. 12, a metal layer 70 is filled in the at least one trench to a first predefined height by a selective deposition process, and a first silicon nitride layer 80 is formed on the metal layer 70 to be filled in the at least one trench 13 to a second predefined height. The metal layer 70 is surrounded by the remaining portion of the titanium nitride layer 50, and includes a material selected from ruthenium and cobalt. The first silicon nitride layer 80 contacts the metal layer 70 and is surrounded by silicon oxide layer 40.

In at least one embodiment, a side of the metal layer 70 corresponding to one of the at least one trench 13 facing away from the bottom of the corresponding trench 13 is flush with a side of the remaining portion of the titanium nitride layer 50 in the corresponding trench 13 facing away from the bottom of the corresponding trench 13. The first silicon nitride layer 80 is deposited on the side of the metal layer 70 facing away from the bottom of the corresponding trench 13 to be filled in the corresponding trench 13 and the corresponding opening 301.

In at least one embodiment, a thickness of the metal layer 70 in each of the at least one trench 13 along a radial direction of the trench 13 may be 300 Å.

A distance from the side of the metal layer 70 facing away from the bottom of the corresponding trench 13 to the surface 101 of the semiconductor substrate 10 is in a range of 500 Å to 800 Å.

Figure 13:
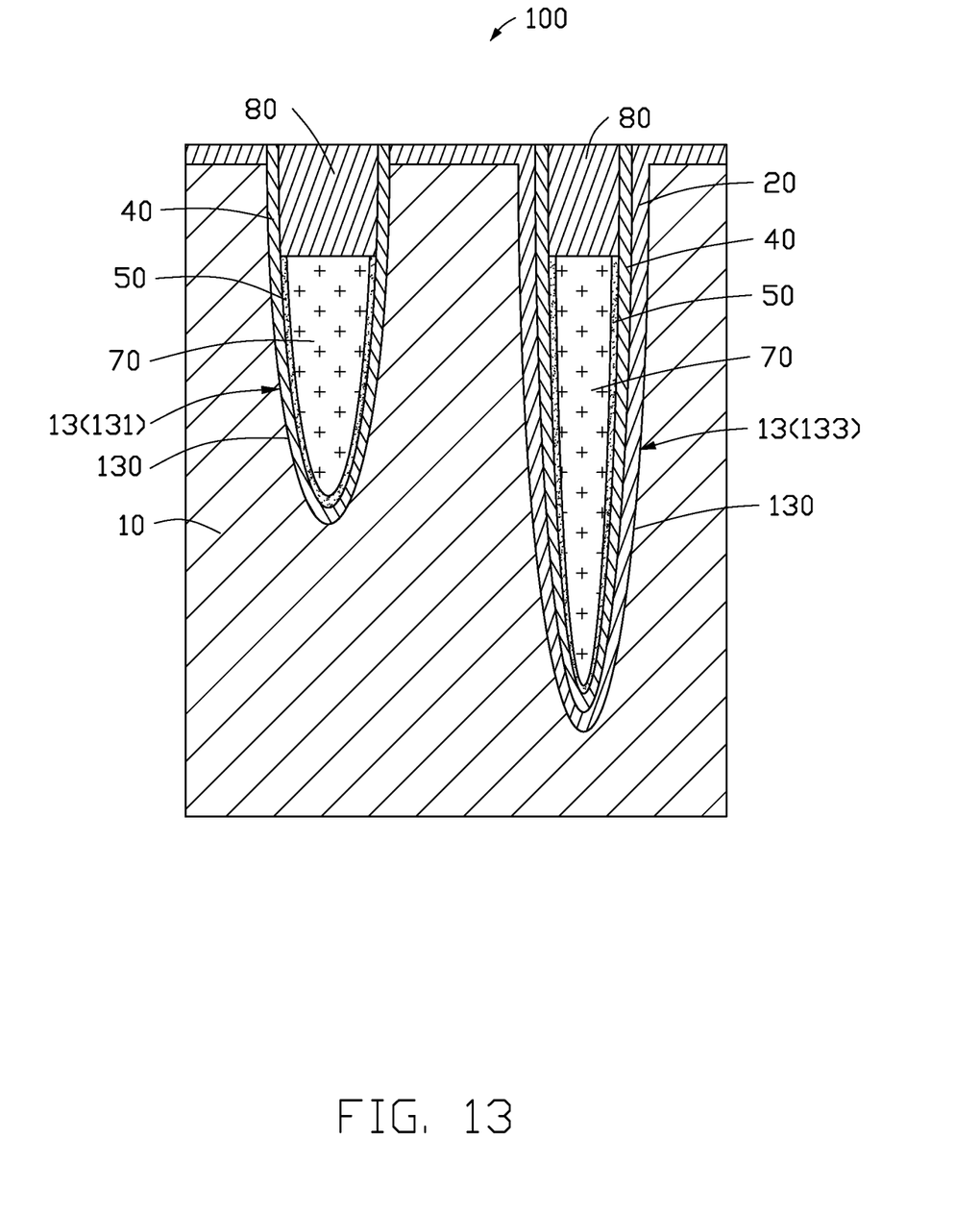
FIG. 13 is a cross-sectional view showing the oxide mask removed from the semiconductor substrate of FIG. 12.

At block 212, referring to FIG. 13, the oxide mask 30 are removed.

In another embodiment, the at least one trench 13 may just include the first trench portion 131 without the second trench portion 133. Then the block 202, 203 and 204 can be omitted.

In another embodiment, the at least one trench 13 may just include the second trench portion 133 without the first trench portion 131. Then the block 204 can be omitted.

Depending on the embodiment, certain of the steps of methods described may be removed, others may be added, and the sequence of steps may be altered. It is also to be understood that the description and the claims drawn to a method may include some indication in reference to sequential steps. However, the indication used is only to be viewed for identification purposes and not as a suggestion as to an order for the steps.

Figure 14:
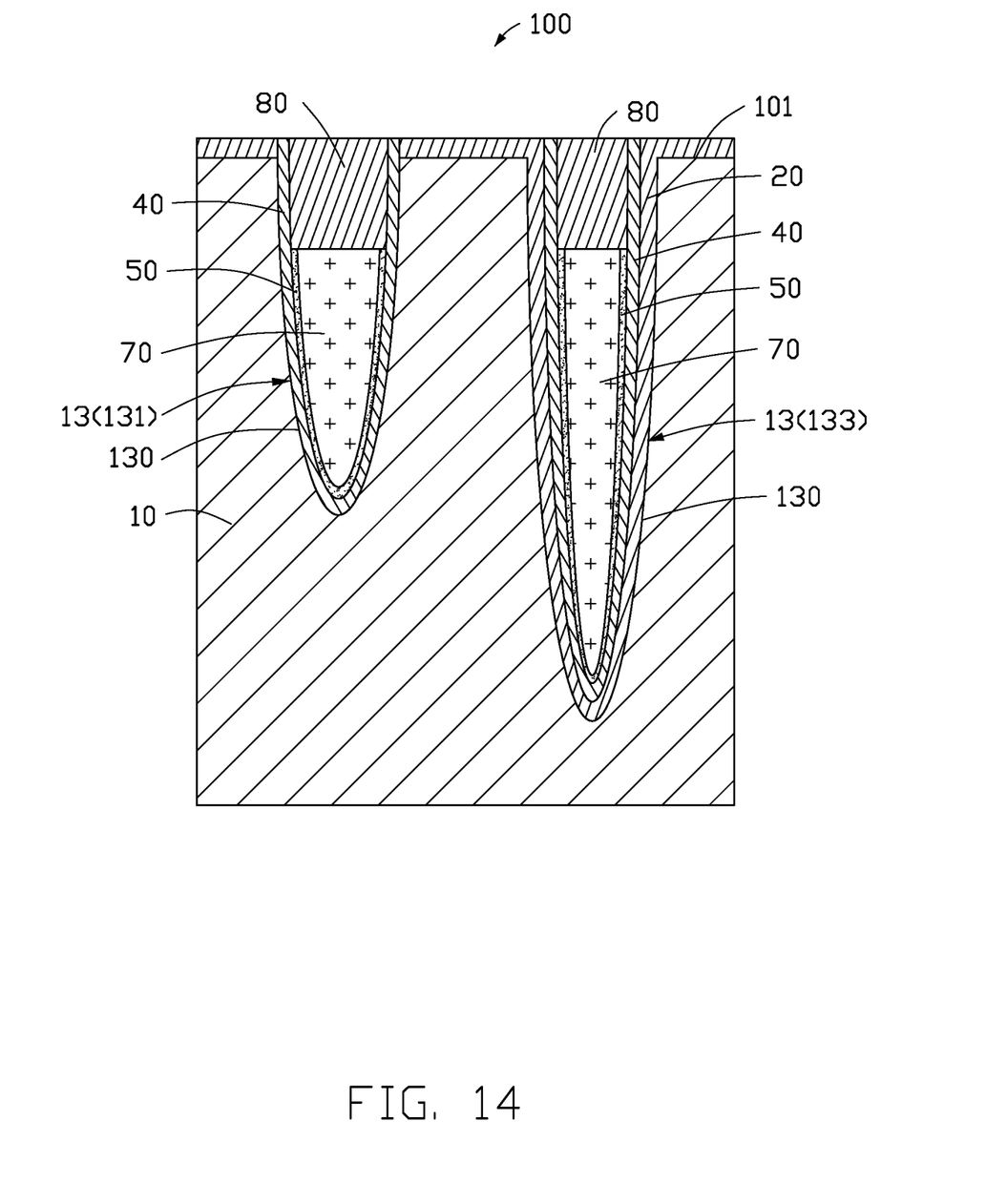
FIG. 14 is a cross-sectional view of an embodiment of a semiconductor device.

FIG. 14 illustrates an embodiment of a semiconductor device 100. The semiconductor device 100 includes a semiconductor substrate 10, a silicon oxide layer 40, a titanium nitride layer 50, a metal layer 70 and a first silicon nitride layer 80. At least one trench 13 is recessed inward from a surface 101 of the semiconductor substrate 10. The silicon oxide layer 40 is formed on an inner wall 130 of the at least one trench 13. The titanium nitride layer 50 is formed on a portion of the silicon oxide layer 40 away from the surface 101 of the semiconductor substrate 10 to cover a portion of the inner wall 130 of the trench 13. The metal layer 70 filled in a portion of each of the at least one trench 13. Wherein the metal layer 70 is selectively deposited on the titanium nitride layer 50, and includes a material selected from ruthenium and cobalt. The first silicon nitride layer 80 is filled in a remaining portion of each of the at least one trench 13, and formed on a side of the metal layer 70 facing away from a bottom of the at least one trench 13.

In at least one embodiment, the metal layer 70 is flush with the titanium nitride layer 50.

In at least one embodiment, a thickness of the silicon oxide layer 40 is in a range of 60 Å to 70 Å. A thickness of the titanium nitride layer 50 is in a range of 10 Å to 20 Å. A thickness of the metal layer 70 in each of the at least one trench 13 along a radial direction of the trench 13 may be 300 Å. A distance from the side of the metal layer 70 corresponding to one of the at least one trench 13 facing away from the bottom of the corresponding trench 13 to the surface 101 of the semiconductor substrate 10 is in a range of 500 Å to 800 Å.

In at least one embodiment, the semiconductor device 100 may further includes a second silicon nitride layer 20. The second silicon nitride layer 20 is located between the inner wall 130 of at least one of the trench 13 and the silicon oxide layer 40.

In at least one embodiment, the second silicon nitride layer 20 may be further located on the surface 101 of the semiconductor substrate 10.

In at least one embodiment, the second silicon nitride layer 20 has a thickness of 250 Å. In another embodiment, the thickness of the second silicon nitride layer 20 may be varied as needed.

The method for fabricating the semiconductor device has a simple process and is easy to operate. In the above method, a formation of a gap can be reduced or even avoided since the metal layer is selectively deposited to correspond to the titanium nitride layer. So that a yield and a service life of the semiconductor device can be improved. Further, the thickness of the titanium nitride layer is in a range of 10 Å to 20 Å, which facilitates the deposition of the metal layer in the trench.

It is to be understood, even though information and advantages of the present embodiments have been set forth in the foregoing description, together with details of the structures and functions of the present embodiments, the disclosure is illustrative only; changes may be made in detail, especially in matters of shape, size, and arrangement of parts within the principles of the present embodiments to the full extent indicated by the plain meaning of the terms in which the appended claims are expressed.

What is claimed is:

1. A method for fabricating a semiconductor device, the method comprising:
   recessing at least one trench inward from a surface of a semiconductor substrate;
   forming a silicon oxide layer on an inner wall of the at least one trench;
   forming a titanium nitride layer on the surface of the semiconductor substrate and the silicon oxide layer;
   forming a spin-on hard mask on the titanium nitride layer, wherein the spin-on hard mask comprises a first portion above the surface of the semiconductor substrate and a second portion filled in the at least one trench;
   performing an etch back process to remove the first portion and a part of the second portion to expose a portion of the titanium nitride layer;
   removing the exposed titanium nitride layer, wherein a remaining portion of the titanium nitride layer is encircled by a remaining part of the second portion and the silicon oxide layer;
   performing an ashing process to remove the remaining part of the second portion to expose the remaining portion of titanium nitride layer;
   filling a metal layer in the at least one trench to a first predefined height by a selective deposition process, wherein the metal layer is surrounded by the remaining portion of the titanium nitride layer; and
   filling a first silicon nitride layer in the at least one trench to a second predefined height,
   wherein the first silicon nitride layer contacts the metal layer and is surrounded by the silicon oxide layer, and the metal layer includes a material selected from ruthenium and cobalt.

2. The method of claim 1, wherein a thickness of the silicon oxide layer is in a range of 60 Å to 70 Å, and a thickness of the titanium nitride layer is in a range of 10 Å to 20 Å.

3. The method of claim 1, wherein a distance from a side of the metal layer to the surface of the semiconductor substrate is in a range of 500 Å to 800 Å.

4. The method claim 1, wherein the metal layer has a thickness of 300 Å.

5. The method claim 1, wherein the method of forming the silicon oxide layer on the inner wall comprises:
   forming a second silicon nitride layer on the inner wall; and
   forming the silicon oxide layer on the second silicon nitride layer.

6. The method claim 5, wherein the second silicon nitride layer has a thickness of 250 Å.

7. The method claim 1, wherein the method of forming the silicon oxide layer on the inner wall comprises:
   forming a second silicon nitride layer on the inner wall and the surface of a semiconductor substrate;
   forming an oxide mask on a portion of the second silicon nitride layer corresponding to the surface of the semiconductor substrate, the oxide mask comprising an opening corresponding to each of the at least one trench; and
   forming the silicon oxide layer on the second silicon nitride layer and a side wall of the opening,
   wherein the method forming the titanium nitride layer on the surface of the semiconductor substrate and the silicon oxide layer comprises:
   forming the titanium nitride layer on the silicon oxide layer and an upper surface of the oxide mask facing away from the semiconductor substrate.

8. The method of claim 7, wherein the second silicon nitride layer has a thickness of 250 Å.

9. The method of claim 1, wherein the at least one trench comprises at least one first trench portion and at least one second trench portion, each first trench portion is spaced from the at least one second trench portion, the method of forming the silicon oxide layer on the inner wall comprises:
   forming a second silicon nitride layer on the inner wall of the at least one first trench portion and the at least one second trench portion, and the surface of the semiconductor substrate;
   forming an oxide mask on a portion of the second silicon nitride layer corresponding to the surface of the semiconductor substrate, the oxide mask comprising an opening corresponding to each of the at least one trench;
   removing a portion of the second silicon nitride layer on the inner wall of the at least one first trench portion; and
   forming the silicon oxide layer on the inner wall of the at least one first trench portion, the second silicon nitride layer in the at least one second trench portion, and a side wall of the opening;
   wherein the method forming the titanium nitride layer on the surface of the semiconductor substrate and the silicon oxide layer comprises:
   forming the titanium nitride layer on the silicon oxide layer and an upper surface of the oxide mask facing away from the semiconductor substrate.

10. The method of claim 9, wherein the second silicon nitride layer has a thickness of 250 Å.

* * * * *